United States Patent [19]

Narasimhan et al.

[11] Patent Number: 5,972,178

[45] Date of Patent: *Oct. 26, 1999

[54] CONTINUOUS PROCESS FOR FORMING IMPROVED TITANIUM NITRIDE BARRIER LAYERS

[75] Inventors: Murali K. Narasimhan, San Jose; Kenny King-Tai Ngan, Fremont; Nitin Khurana, Santa Clara; Bradley O. Stimson, Mountain View, all of Calif.

[73] Assignee: Applied Materials, Inc., Santa Clara, Calif.

[*] Notice: This patent is subject to a terminal disclaimer.

[21] Appl. No.: 08/481,550

[22] Filed: Jun. 7, 1995

[51] Int. Cl.⁶ .................................................. C23C 14/34
[52] U.S. Cl. .............................. 204/192.17; 204/192.15
[58] Field of Search ..................... 204/192.12, 192.15, 204/192.17, 192.22; 437/192

[56] References Cited

U.S. PATENT DOCUMENTS

| 5,232,871 | 8/1993 | Ho ............................................ 437/190 |
| 5,240,880 | 8/1993 | Hindman et al. .............. 204/192.17 X |
| 5,378,660 | 1/1995 | Ngan et al. ............................. 437/247 |
| 5,439,574 | 8/1995 | Kobayashi et al. ................. 204/192.12 |

FOREIGN PATENT DOCUMENTS

| 1275332 | of 0000 | Canada .......................... H01L 23/48 |
| 545602 | 6/1993 | European Pat. Off. ...... H01L 21/285 |
| 598422 | 5/1994 | European Pat. Off. .... H01L 21/3205 |
| 680077 | 11/1995 | European Pat. Off. ...... H01L 21/285 |
| 8130302 | 5/1996 | Japan .............................. H01L 21/28 |

OTHER PUBLICATIONS

Liao et al, "Ti/TiN Barrier Enhancement for Aluminum Plug Interconnect Technology", VMIC Conference, 1994, ISMIC—103/94/0428 pp. 428–434.

Dixit et al, "REactively sputtered titanium nitride films for submicron contact barrier metallization", Appl. Phys. Lett. 62 (4) 15. Jan. 1993 pp. 357–359.

*Primary Examiner*—Nam Nguyen
*Attorney, Agent, or Firm*—Birgit E. Morris; Donald Verplancken

[57] ABSTRACT

A continuous process for the deposition of robust titanium-containing barrier layers comprises sputtering in a single substrate sputtering chamber a first layer of titanium, sputtering a layer of titanium nitride thereover, treating the titanium nitride layer with a plasma containing oxygen while continuing to sputter the titanium target to deposit a thin layer of TiON, and finally sputtering a layer of titanium over the titanium nitride. The latter step removes impurities from the titanium target, preventing poisoning of the target. Thus subsequent substrates can be continuously processed in said chamber without degrading the barrier properties or poisoning the titanium target.

6 Claims, 2 Drawing Sheets

CONTINUOUS PROCESS FOR FORMING IMPROVED TITANIUM NITRIDE BARRIER LAYERS

This invention relates to the deposition of titanium nitride barrier layers prior to depositing an aluminum contact. More particularly, this invention relates to a continuous process for forming improved titanium nitride barrier layers.

BACKGROUND OF THE INVENTION

Titanium nitride is a known barrier material used to prevent spiking of aluminum contacts into a silicon substrate. Titanium nitride can be deposited by sputtering; either by sputtering a layer of titanium in the presence of nitrogen gas, or, preferably, a contact layer of titanium is deposited first and a layer of titanium nitride sputtered thereover. Since the initial titanium layer sputtered in argon contains no impurities, the contact resistance is not adversely affected. However, untreated titanium nitride barrier layers can only be used to prevent spiking of an overlying aluminum contact layer below temperatures of about 350–450° C.

Thus it is also known to enhance the barrier properties of titanium nitride by annealing or incorporating oxygen into the film. The oxygen fills the spaces between the grain boundaries of the titanium nitride. Annealing can be carried out in a Rapid Thermal Anneal (RTA) chamber, or by heating in a nitrogen atmosphere containing oxygen. This is known as "stuffing" the titanium nitride layer. Such titanium nitride barrier layers can be heated above the flow temperature of aluminum contacts, thus permitting the aluminum to be heated sufficiently to flow in contact openings, ensuring that the openings are completely filled and that voids are not present.

As substrate wafer sizes become larger, and devices made in the wafers become smaller and are placed closer together, many problems have arisen in filling small openings with material in a conformal manner that avoids the formation of voids. As the aspect ratio of openings becomes higher (the ratio of width to depth) it becomes more difficult to fill openings by sputtering.

Liao et al, in an article entitled "Ti/TiN Barrier Enhancement for Aluminum Plug Interconnect Technology", VMIC Conf. 1994 ISMIC-103/94 pp 428–434, disclosed an RTA treatment of a sputtered, low density titanium/titanium nitride stack, which formed a TiON layer at the titanium/titanium nitride interface. Their suggested process requires sputtering 550 Å of titanium in the contact opening first, followed by sputtering 500 Å of titanium nitride. These depositions can be carried out in the same chamber. However, the wafers are then exposed to air and heated to 650° C. in an RTA chamber, which requires a break in the vacuum and transfer of the substrate to an RTA chamber prior to the deposition of the aluminum contact layer. This extra step and extra transfer of the substrate reduces the throughput of the system and thus increases the costs of producing the contact. Further, we have found that this process does not completely eliminate aluminum spiking.

Ho et al, U.S. Pat. No. 5,232,871, describe the preparation of TiN barrier layers for MOS devices which are said to prevent aluminum contacts from interdiffusion or spiking into an underlying silicon layer. The TiN layer can be annealed or can be treated with an oxygen plasma that reacts with the titanium nitride layer. Aluminum is then sputter deposited, possibly in the same cluster tool. The annealing step or the oxygen plasma treatment require a separate annealing or plasma process chamber, which requires an additional transfer of the wafer, and thus increases the cost and decreases the throughput of this process.

Thus efforts to provide improved titanium nitride barrier layers with improved barrier properties and that can be operated in a continuous manner using a minimum number of processing chambers at low cost have continued.

SUMMARY OF THE INVENTION

We have found that the deposition of titanium/titanium nitride barrier layers and their subsequent treatment with an oxygen plasma can be carried out in a single sputtering chamber and, by depositing a thin top layer of titanium after the oxygen plasma treatment, the titanium target is cleaned to remove nitrogen-containing and oxygen-containing impurities. This step eliminates poisoning of the titanium target and has the added benefit that the first titanium layer deposited onto a successive substrate in the sputtering chamber is a pure titanium layer free of oxygen and nitrogen contaminants. Thus both the depositions and enhancement of the barrier layer with oxygen takes place in the same chamber, which, additionally, can be used continuously for mass production processing.

DETAILED DESCRIPTION OF THE INVENTION

In accordance with the preferred process of the invention, a first titanium layer is sputter deposited from a Ti target in argon onto a substrate, generally a silicon wafer having openings for the deposition of aluminum contacts, in a sputtering chamber fitted with a source of RF power connected to the substrate support. After sputter deposition of a second titanium nitride layer using an argon-nitrogen gas mixture, a small amount of oxygen is added to the argon used for sputter deposition, and the RF power is turned on, thereby forming a plasma of the oxygen adjacent to the substrate. The titanium target is simultaneously sputtered by continuing to apply a low level of DC power, about 500 watts, to the target. Since only a small amount of oxygen is required to enhance the barrier properties of the titanium nitride layer, the flow of argon is continued in order to sustain the plasma. This plasma treatment forms a thin layer of TiON at the surface of the titanium nitride layer, which is thick enough to provide an additional barrier against aluminum spiking, but not so thick as to reduce the resistivity of the contact. A TiON layer about 20–100 Å thick is preferred, and is formed in about 30 seconds.

A final thin titanium top layer optionally can be deposited over the treated titanium nitride, also in the same sputtering chamber. This final sputter deposition provides a final metal layer over the barrier layer about 80–200 Å thick. This step has the added advantage that the titanium target is cleaned, e.g., any titanium nitride or titanium oxide deposited on the target during the prior TiN deposition or the oxygen plasma treatment step is sputtered off, leaving a clean titanium target for deposition of the first titanium layer on the next substrate brought into the chamber. This final sputtering step eliminates the need to periodically clean the target. Thus the throughput of the present process for continuous substrate processing is also improved.

The substrate having the titanium-containing trilayer deposited thereon can then be transferred to an aluminum deposition chamber, also generally deposited by sputtering in argon in known manner, for forming the final aluminum contact.

The initial titanium layer can be deposited over silicon, as when a contact opening is formed in the surface of a silicon wafer, or can be deposited over a dielectric silicon oxide layer.

Figure 1:
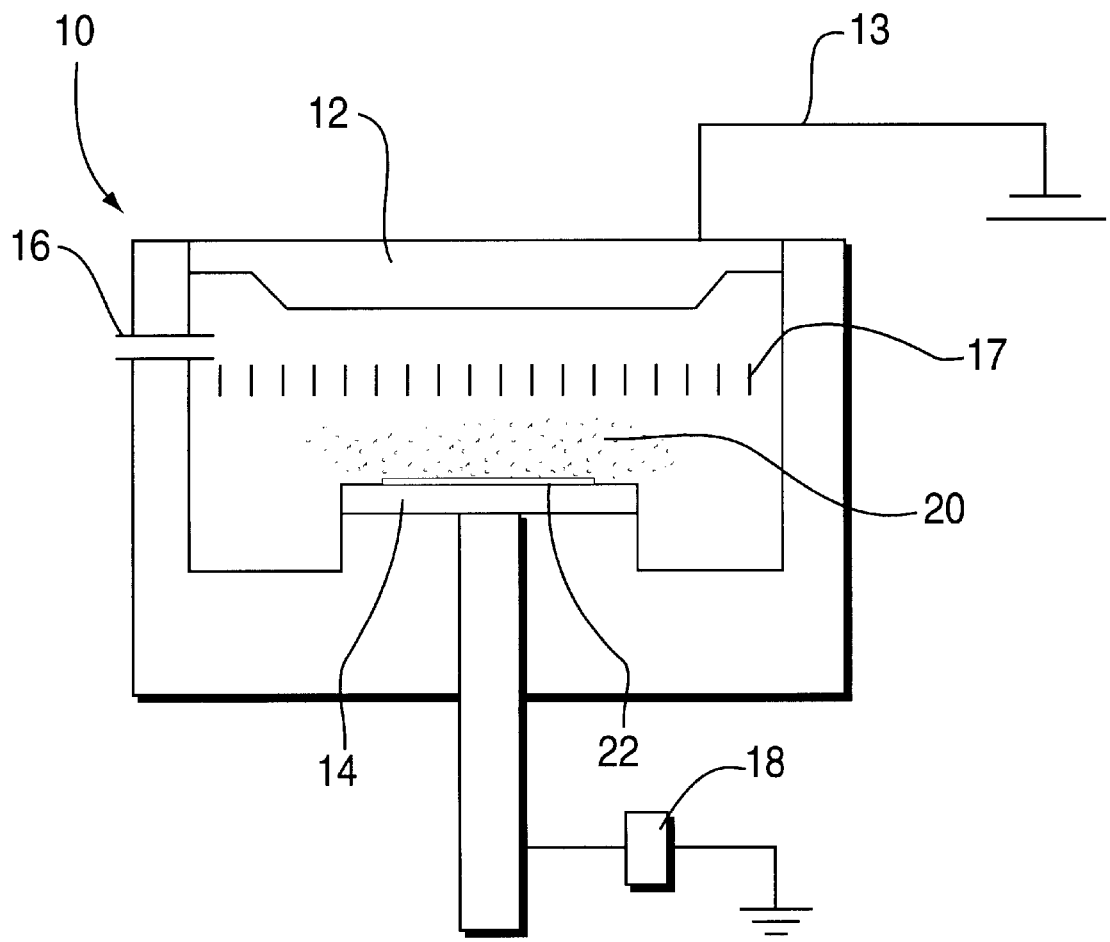
FIG. 1 is a cross sectional schematic view of a sputtering chamber in which the present process can be carried out.

FIG. 1 illustrates a sputtering chamber 10 suitable for carrying out the present process. The chamber 10 includes a titanium target 12, connected to a DC power source 13. A substrate 22, such as a silicon wafer, having a plurality of exposed openings in which aluminum contacts are to be formed, is mounted on a substrate support 14. The chamber 10 is also provided with a gas inlet 16. A collimator 17 is optionally placed between the target 12 and the substrate support 14. A source of RF power 18 is connected to the substrate support 14. A flow of argon is started in the chamber and the electrodes powered from the DC power supply 13, when a thin first layer of titanium is sputtered onto the substrate 22. Nitrogen is then added to the argon, sputter depositing a layer of titanium nitride onto the substrate 22. The nitrogen flow is stopped and a mixture of oxygen and argon is added to the chamber 10. The RF power 18 is turned on, forming an oxygen plasma in the chamber in a plasma region 20 that reacts with the titanium nitride surface to stuff the titanium nitride. The titanium target 12 is sputtered simultaneously by continuing to apply DC power to the target 12, thus depositing a thin layer of $TiO_2$. After turning off the oxygen, a final layer of pure titanium is sputter deposited, e.g., for about 3 seconds, which also cleans the titanium target 12. The substrate 22 is then transferred to an aluminum deposition chamber.

Although the amount of RF power used to initiate the plasma in the chamber can vary from about 25–200 watts without changing the characteristics of the barrier layer obtained, high power levels increase the amount of bias seen by the substrate. Thus preferably the RF power is maintained at a comparatively low level, for example about 25–200 watts at 400 kHz. Higher levels of DC power lead to formation of a thick layer of $TiO_2$. This is undesirable because $TiO_2$ is an insulator that will adversely affect the resistance of the contact being made. The temperature during sputtering is also maintained on the low side, about 100° C., but can be increased up to about 550° C. if necessary.

Thus the tri-part titanium-containing barrier layer and treatment thereof with oxygen plasma can all occur in the same chamber, increasing the throughput of the system. The properties of the resultant barrier layers are just as good as those made in accordance with prior art processes that require processing in more than one chamber, such as the system of Liao et al which requires transfer to an RTA chamber between sputtering steps.

The invention will be further described in the following examples, but the invention is not meant to be limited to the details disclosed therein.

EXAMPLE 1

A layer of titanium about 200 Å thick and a layer of titanium nitride about 800 Å was sputter deposited onto a silicon wafer in conventional manner using an argon gas flow of 140 sccm and applying 500 watts of DC power to the target in the chamber as in FIG. 1. The silicon wafer was provided with exposed contact openings less than 1 micron in diameter and having an aspect ratio greater than 2:1. After deposition of the titanium and titanium nitride layers, the gas flow was changed to supply a mixture of 155 sccm of argon and 80 sccm of oxygen, and RF power of 400 kHz at 25–50 watts was turned on. Oxygen flow and RF power was continued for 30 seconds while applying 500 watts of DC power to the titanium target. A thin layer of TiON was deposited. After shutting off the oxygen and RF power, a final titanium layer was sputter deposited for 3 seconds.

The wafer was transferred to an aluminum sputtering chamber and a layer of aluminum 5000Å thick was sputter deposited at 300° C.

Figure 2:
FIG. 2 is a photomicrograph of an aluminum contact processed according to the invention after annealing above 500° C.

The resultant aluminum contact was heated at 550° C. in nitrogen for three hours. No aluminum spiking was observed, as shown in the attached FIG. 2.

Figure 3:
FIG. 3 is a photomicrograph of an aluminum contact processed according to the prior art after annealing above 500° C.

As a control, a conventional titanium/titanium nitride stack was sputter deposited onto a silicon wafer, with no post treatment of the layer. A 5000 Å thick layer of aluminum was deposited on the Ti/TiN stack without exposure to air. After heating at 550° C. for one hour, severe spiking was observed, as can be seen in FIG. 3

EXAMPLE 2

The resistance properties of both low pressure and high pressure titanium nitride layers were compared before treatment with oxygen and after treatment with oxygen. The sheet resistance, resistance uniformity and stress were measured. The results are summarized below:

|  | $R_s$ ohms/sq | $R_s$ Unif. % 1 - σ | Stress dynes/cm$^2$C |
| --- | --- | --- | --- |
| Low Pressure TiN |  |  |  |
| Before $O_2$ Treatment | 21.02 | 1.7 | −9.0 E9 |
| After $O_2$ Treatment | 20.99 | 1.3 | −6.6 E9 |
| High Pressure TiN |  |  |  |
| Before $O_2$ Treatment | 100.6 | 2.7 | −1.8 E9 |
| After $O_2$ Treatment | 139.5 | 2.7 | −7.0 E8 |

Thus the change in film properties is minimal and the present process permits easy integration with standard integrated circuit processing.

EXAMPLE 3

A TiN barrier layer 1000 Å thick was sputter deposited and plasma treated in an argon-oxygen atmosphere for 30 seconds in a single wafer chamber as in Example 1 onto over 700 silicon wafers sequentially. After 425 wafers had been processed, a 1 micron thick layer of titanium was deposited to completely remove contaminants from the titanium target. Deposition onto the remaining wafers was then continued.

A particle count was performed on the wafers No. 0, 75, 425 and 720. The results are given below as particles added per wafer. The tests were done on the deposited films after processing.

| Number of wafer | Particles added |
| --- | --- |
| 0 | 0 |
| 50 | 3.5 |
| 425 | 0 |
| 720 | 0.33 |

This shows that very few particles are generated during the process of the invention. Thus the present process is eminently suitable for mass production.

Although the invention has been described in terms of particular embodiments, one skilled in the art would know how to vary deposition conditions and times and equipment without departing from the spirit of the invention, and these variations are meant to be included herein. The invention is only to be limited by the scope of the appended claims.

We claim:

1. A continuous method for forming improved titanium-containing barrier layers in a single substrate sputtering chamber including a target, a DC source connected to the target, a substrate support, an RF power supply connected to the substrate support and a gas inlet comprising the following steps in sequence:

a) transferring a substrate into said chamber and sputter depositing in argon atmosphere a first layer of titanium onto said substrate;

b) sputter depositing a second layer of titanium nitride in an atmosphere of argon and nitrogen onto said substrate;

c) turning on the RF power supply and forming a plasma adjacent to the substrate from a mixture of argon and oxygen while continuing to sputter the titanium target by applying DC power to the target to form an oxygen-treated titanium nitride layer;

d) turning off the oxygen and sputter depositing a second layer of titanium over the oxygen-treated nitride layer for at least about three seconds; and e) transferring said substrate out of said chamber; and f) transferring another substrate into said chamber, and repeating steps a) to e).

2. A method according to claim 1 wherein the combined thickness of the first titanium layer and the titanium nitride layer is about 1000 Å.

3. A method according to claim 1 wherein said titanium nitride layer is treated in the oxygen plasma for about 30 seconds to form a TiON layer.

4. A method according to claim 3 wherein a layer of TiON about 20–100 Å thick is deposited.

5. A method according to claim 1 wherein said second titanium layer is about 80–200 Å thick.

6. A method according to claim 1 wherein after transferring the substrate out of the chamber, a layer of aluminum is deposited thereover in a second vacuum chamber.

* * * * *